United States Patent
Gaal et al.

(10) Patent No.: US 8,494,072 B2
(45) Date of Patent: Jul. 23, 2013

(54) FREQUENCY DIVERSE CONTROL MAPPING OF CHANNEL ELEMENTS TO RESOURCE ELEMENTS

(75) Inventors: Peter Gaal, San Diego, CA (US); Yongbin Wei, San Diego, CA (US); Byoung-Hoon Kim, Seoul (KR); Durga Prasad Malladi, San Diego, CA (US); Juan Montojo, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1109 days.

(21) Appl. No.: 12/264,815

(22) Filed: Nov. 4, 2008

(65) Prior Publication Data

US 2009/0116573 A1 May 7, 2009

Related U.S. Application Data

(60) Provisional application No. 60/985,908, filed on Nov. 6, 2007.

(51) Int. Cl.
*H04B 7/02* (2006.01)
(52) U.S. Cl.
USPC ........... 375/267; 375/260; 375/259; 375/299; 375/295; 370/330; 370/203; 370/329; 370/436
(58) Field of Classification Search
USPC .......... 375/267, 260, 259, 299, 295; 370/330, 370/203, 329, 436
See application file for complete search history.

(56) References Cited

U.S. PATENT DOCUMENTS

| | | | |
|---|---|---|---|
| 2006/0156199 A1* | 7/2006 | Palanki et al. | 714/776 |
| 2008/0225791 A1* | 9/2008 | Pi et al. | 370/330 |
| 2010/0118800 A1* | 5/2010 | Kim et al. | 370/329 |
| 2010/0232379 A1* | 9/2010 | Molnar et al. | 370/329 |
| 2010/0260036 A1* | 10/2010 | Molnar et al. | 370/203 |

FOREIGN PATENT DOCUMENTS

| | | |
|---|---|---|
| EP | 1944893 A1 | 7/2008 |
| WO | WO2006069392 | 6/2006 |
| WO | WO2007052649 | 5/2007 |

OTHER PUBLICATIONS

Taiwan Search Report—TW097142908—TIPO—Mar. 14, 2012.
International Search Report & Written Opinion—PCT/US2008/082690, International Search Authority—European Patent Office—Feb. 26, 2009.
Zyren Jim. "Overview of the 3GPP Long Term Evolution Physical Layer" White Paper. 27 pages, Jul. 2007.

* cited by examiner

*Primary Examiner* — Kenneth Lam
(74) *Attorney, Agent, or Firm* — Larry J. Moskowitz

(57) ABSTRACT

Aspects relate to a flexible interleaving scheme that provides frequency diversity to randomizes interference Frequency diversity groups can be utilized, wherein control channel elements (CCEs) gain greater frequency diversity for a given number of mini-CCEs (e.g., subset of CCEs). A frequency diversity group index is permuted according to a bit reversed scheme to facilitate control channel elements with a small number of mini-CCEs to also gain sufficient frequency diversity.

18 Claims, 12 Drawing Sheets

FREQUENCY DIVERSE CONTROL MAPPING OF CHANNEL ELEMENTS TO RESOURCE ELEMENTS

CROSS-REFERENCE

This application claims the benefit of U.S. Provisional Application Ser. No. 60/985,908, filed Nov. 6, 2007, entitled "Method and Apparatus for Frequency Diverse Control Mapping of Channel Elements to Resource Elements," and assigned to the assignee hereof and the entirety of which is incorporated herein by reference.

BACKGROUND

I. Field

The following description relates generally to communication systems and more particularly to a flexible interleaving scheme to enable frequency diversity and to randomize interference.

II. Background

Wireless communication systems are widely deployed to provide various types of communication and to communicate information regardless of where a user is located (e.g., inside or outside a structure) and whether a user is stationary or moving (e.g., in a vehicle, walking). For example, voice, data, video and so forth can be provided through wireless communication systems. A typical wireless communication system, or network, can by multiple-access systems capable of supporting communication with multiple users by sharing the available system resources (e.g., bandwidth and transmit power). A system can use a variety of multiple access techniques such as Frequency Division Multiplexing (FDM), Time Division Multiplexing (TDM), Code Division Multiplexing (CDM), Orthogonal Frequency Division Multiplexing (OFDM), 3GPP Long Term Evolution (LTE), and others.

Generally, a wireless multiple-access communication system can simultaneously support communication for multiple wireless terminals. Each terminal communicates with one or more base stations through transmissions on the forward and reverse links. The forward link (or downlink) refers to the communication link from the base stations to the terminals, and the reverse link (or uplink) refers to the communication link from the terminals to the base stations. This communication link can be established through a single-in-single-out, multiple-in-single-out or a multiple-in-multiple-out (MIMO) system.

A MIMO system employs multiple (NT) transmit antennas and multiple (NR) receive antennas for data transmission. A MIMO channel formed by the NT transmit and NR receive antennas can be decomposed into NS independent channels, which are also referred to as spatial channels, where $N_S \leq \min\{N_T, N_R\}$. Each of the NS independent channels corresponds to a dimension. The MIMO system can provide improved performance (e.g., higher throughput and/or greater reliability) if the additional dimensionalities created by the multiple transmit and receive antennas are utilized.

A MIMO system supports time division duplex (TDD) and frequency division duplex (FDD) systems. In a TDD system, the forward and reverse link transmissions are on the same frequency region so that the reciprocity principle allows the estimation of the forward link channel from the reverse link channel. This enables the access point to extract transmit beamforming gain on the forward link when multiple antennas are available at the access point.

Various interleaving schemes (e.g., arrangement of data) have poor autocorrelation (e.g., finding repeating patterns) properties. This can be due to inherent repeating differential patterns found in these interleaving schemes. Differential patterns refers to the fact that there can be found pairs of sets of n consecutive sequence indexes where the locations of the elements are related by a linear offset, both before and after the interleaving. However, the two offsets do not need to be the same.

Some communication systems utilize a two-stage interleaving scheme. In this type of scheme, control channel elements are mapped across symbols and then an independent interleaving is performed in each symbol. However, these two-stage interleaving schemes do not provide adequate frequency diversity within the symbols or across the symbols.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in connection with frequency diverse control mapping of control channel elements to resource elements. Aspects relate to a flexible interleaving scheme that provides frequency diversity that randomizes interference across base stations. Further, some aspects relate to utilizing frequency diversity groups, wherein control channel elements (CCEs) gain greater frequency diversity for a given number of mini-CCEs (e.g., subset of CCEs). A frequency diversity group index is permuted according to a bit reversed scheme to facilitate control channel elements with a small number of mini-CCEs to also gain sufficient frequency diversity.

An aspect relates to a method for enabling frequency diversity. The method includes defining diversity regions across a network bandwidth, binning available mini-control channel elements to the defined diversity regions, and performing a bit-reverse interleave on diversity region indices. The method also includes mapping the mini-control channel elements to the binned diversity regions and randomly permuting the control elements in each diversity region. Further, method includes applying cell dependent cyclic shift in the frequency domain and establishing a mapping between available mini-control channel elements and resource elements.

Another aspect relates to a wireless communications apparatus that includes a memory and a processor. The memory retains instructions related to defining diversity regions across a network bandwidth and binning available mini-control channel elements to the defined diversity regions. The memory also retains instructions related to performing a bit-reverse interleave on diversity region indices, mapping the mini-control channel elements to the binned diversity regions, and randomly permuting the control elements in each diversity region. Further, the memory includes applying cell dependent cyclic shift in the frequency domain and establishing a mapping between available minicontrol channel elements and resource elements. The processor is coupled to the memory and is configured to execute the instructions retained in the memory.

Still another aspect relates to a wireless communications apparatus that enables frequency diversity. The apparatus includes means for defining diversity regions across a network bandwidth and means for binning available mini-control channel elements to the defined diversity regions. Also included in apparatus is means for performing a bit-reverse interleave on diversity region indices and means for mapping the mini-control channel elements to the binned diversity regions. Apparatus also includes means for permuting the control elements in each diversity region, means for applying cell dependent cyclic shift in the frequency domain, and means for establishing a mapping between available mini-control channel elements and resource elements.

Yet another aspect relates to a computer program product that includes a computer-readable medium. The computer-readable medium includes a first set of codes for causing a computer to define diversity regions across a network bandwidth, wherein the diversity regions are defined separately for each symbol and a second set of codes for causing the computer to bin available mini-control channel elements to the defined diversity regions. Also included in computer-readable medium is a third set of codes for causing the computer to perform a bit-reverse interleave on diversity region indices and a fourth set of codes for causing the computer to map the mini-control channel elements to the binned diversity regions. Further, computer-readable medium includes a fifth set of codes for causing the computer to permute the control elements in each diversity region, a sixth set of codes for causing the computer to apply cell dependent cyclic shift in the frequency domain, and a seventh set of codes for causing the computer to establish a mapping between available mini-control channel elements and resource elements.

Still another aspect relates to at least one processor configured to enable frequency diversity. The processor includes a first module for defining diversity regions across a network bandwidth and a second module for binning available mini-control channel elements to the defined diversity regions. Also included in processor is a third module for performing a bit-reverse interleave on diversity region indices and a fourth module for mapping the mini-control channel elements to the binned diversity regions. The processor also includes a fifth module for randomly permuting the control elements in each diversity region, a sixth module for applying cell dependent cyclic shift in the frequency domain, and a seventh module for establishing a mapping between available mini-control channel elements and resource elements.

A further aspect relates to a method for enabling frequency diversity when a symbol has a high initial load. The method includes counting Reference Signal and Physical Control Format Indicator Channel (RS+PCFICH) tones in a symbol with a high initial load. The method also includes allocating Physical Downlink Control Channel (PDCCH) tones in symbols other than the symbol with the high initial load until the PDCCH tones allocated is equal to the counted RS+PCFICH tones and distributing the PDCCH mini-CCEs across all symbols.

Another aspect relates to a wireless communications apparatus that includes a memory and a processor. The memory retains instructions related to counting RS+PCFICH tones in a symbol with a high initial load and allocating PDCCH tones in symbols other than the symbol with the high initial load until the PDCCH tones allocated is equal to the counted RS+PCFICH tones. The memory also retains instructions related to distributing the PDCCH mini-CCEs across all symbols. The processor is coupled to the memory and is configured to execute the instructions retained in the memory.

Yet another aspect relates to a wireless communications apparatus that enables frequency diversity wherein at least one symbol has a high initial load. The apparatus includes means for counting the tones in the symbol with the high initial load and means for allocating PDCCH tones in symbols other than the symbol with the high initial load until the PDCCH tones allocated is equal to the counted tones. Apparatus also includes means for distributing the PDCCH mini-CCEs across all symbols.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of the various aspects may be employed. Other advantages and novel features will become apparent from the following detailed description when considered in conjunction with the drawings and the disclosed aspects are intended to include all such aspects and their equivalents.

DETAILED DESCRIPTION

Figure 1:
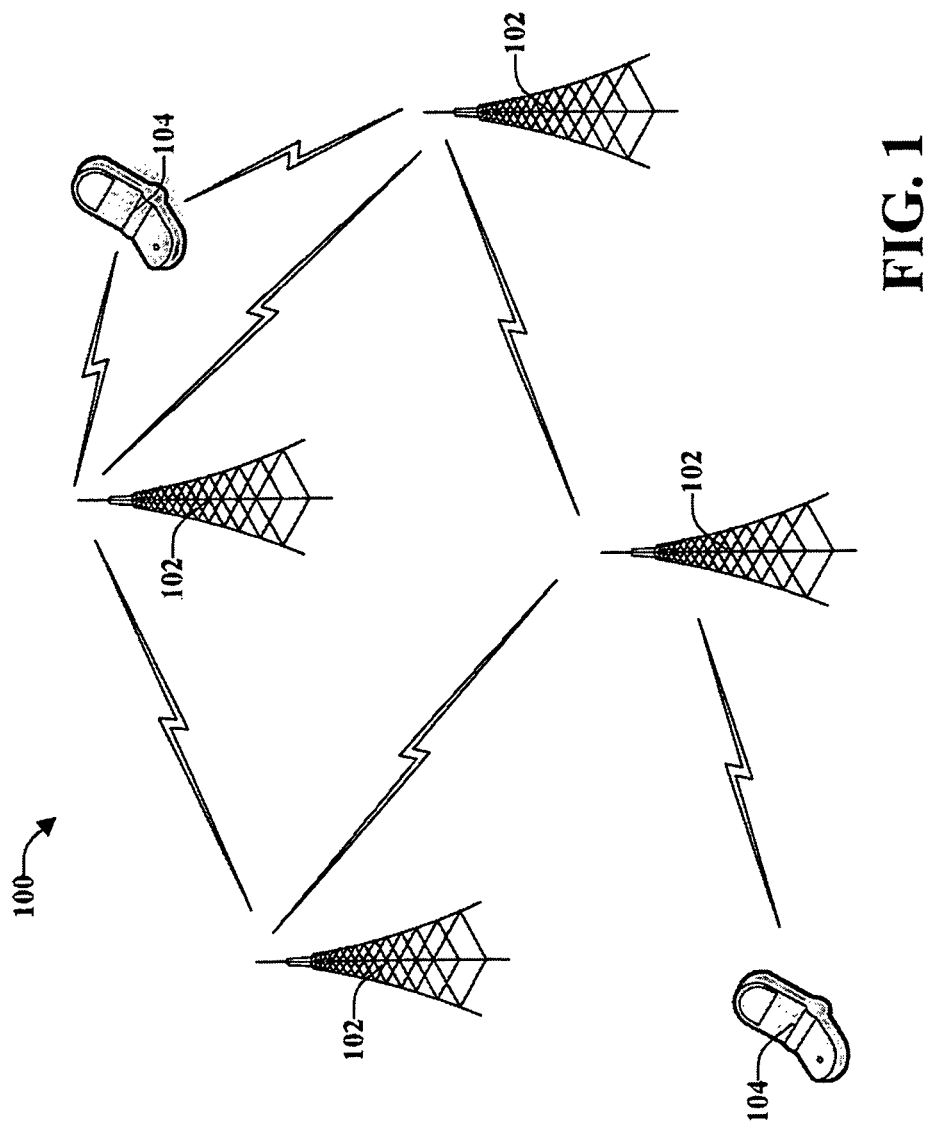
FIG. 1 illustrates a wireless communication system in accordance with various aspects presented herein.

Various aspects are now described with reference to the drawings. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing these aspects.

As used in this application, the terms "component", "module", "system", and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Furthermore, various aspects are described herein in connection with a mobile device. A mobile device can also be called, and may contain some or all of the functionality of a system, subscriber unit, subscriber station, mobile station, mobile, wireless terminal, node, device, remote station, remote terminal, access terminal, user terminal, terminal, wireless communication device, wireless communication apparatus, user agent, user device, or user equipment (UE). A mobile device can be a cellular telephone, a cordless telephone, a Session Initiation Protocol (SIP) phone, a smart phone, a wireless local loop (WLL) station, a personal digital assistant (PDA), a laptop, a handheld communication device, a handheld computing device, a satellite radio, a wireless modem card and/or another processing device for communicating over a wireless system. Moreover, various aspects are described herein in connection with a base station. A base station may be utilized for communicating with wireless terminal(s) and can also be called, and may contain some or all of the functionality of, an access point, node, Node B, e-NodeB, e-NB, or some other network entity.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Additionally, in the subject description, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Referring now to FIG. 1, illustrated is a wireless communication system 100 in accordance with various aspects presented herein. System 100 can comprise one or more base stations 102 in one or more sectors that receive, transmit, repeat, and so forth, wireless communication signals to each other and/or to one or more mobile devices 104. Each base station 102 can comprise multiple transmitter chains and receiver chains (e.g., one for each transmit and receive antenna), each of which can in turn comprise a plurality of components associated with signal transmission and reception (e.g., processors, modulators, multiplexers, demodulators, demultiplexers, antennas, and so forth). Each mobile device 104 can comprise one or more transmitter chains and receiver chains, which can be utilized for a multiple input multiple output (MIMO) system. Each transmitter and receiver chain can comprise a plurality of components associated with signal transmission and reception (e.g., processors, modulators, multiplexers, demodulators, demultiplexers, antennas, and so on), as will be appreciated by one skilled in the art.

System 100 can be configured to provide frequency diversity groups wherein control channel elements (CCEs) achieve a more favorable frequency diversity for a given number of mini-CCEs. Further, system 100 is configured to provide a frequency diversity group index that is permuted according to a bit reversed scheme. Utilization of the bit reversed scheme can provide that control channel elements with a small number of mini-CCEs are able to gain sufficient frequency diversity.

Figure 2:
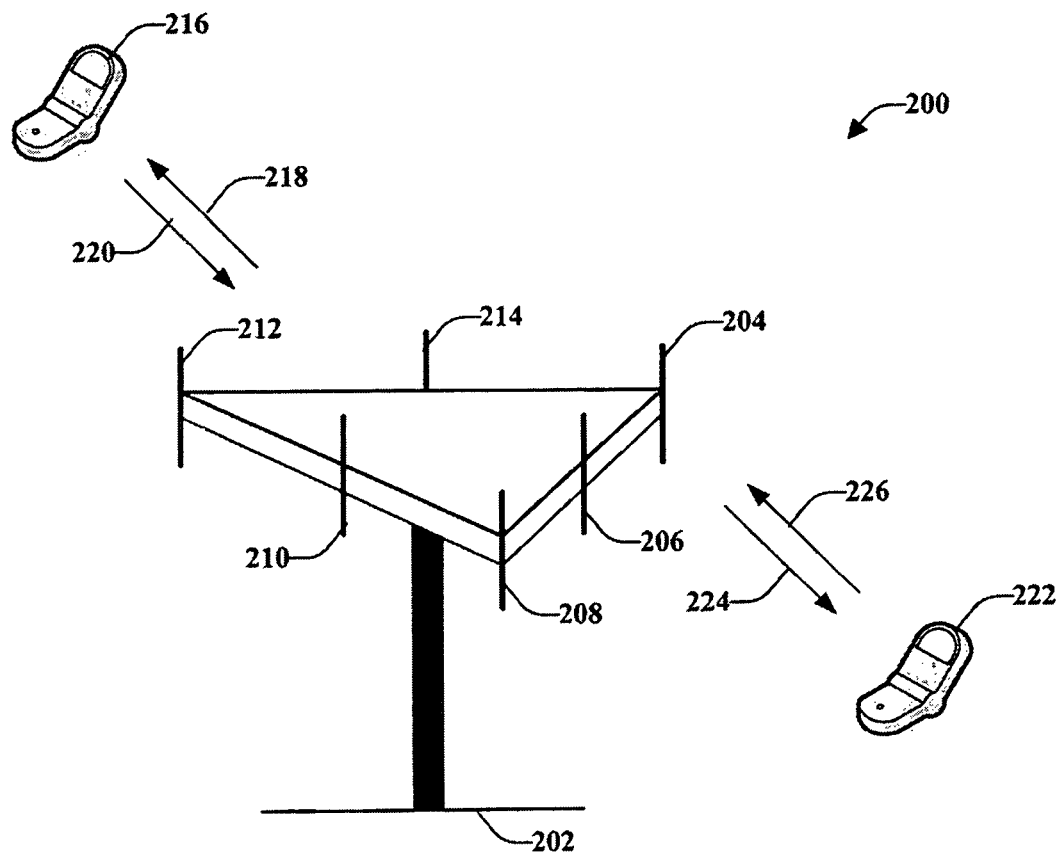
FIG. 2 illustrates a multiple access wireless communication system according to one or more aspects.

Referring now to FIG. 2, a multiple access wireless communication system 200 according to one or more aspects is illustrated. A wireless communication system 200 can include one or more base stations in contact with one or more user devices. Each base station provides coverage for a plurality of sectors. A three-sector base station 202 is illustrated that includes multiple antenna groups, one including antennas 204 and 206, another including antennas 208 and 210, and a third including antennas 212 and 214. According to the figure, only two antennas are shown for each antenna group, however, more or fewer antennas may be utilized for each antenna group. Mobile device 216 is in communication with antennas 212 and 214, where antennas 212 and 214 transmit information to mobile device 216 over forward link 218 and receive information from mobile device 216 over reverse link 220. Forward link (or downlink) refers to the communication link from the base stations to mobile devices, and the reverse link (or uplink) refers to the communication link from mobile devices to the base stations. Mobile device 222 is in communication with antennas 204 and 206, where antennas 204 and 206 transmit information to mobile device 222 over forward link 224 and receive information from mobile device 222 over reverse link 226. In a FDD system, for example, communication links 218, 220, 224, and 226 might utilize different frequencies for communication. For example, forward link 218 might use a different frequency than the frequency utilized by reverse link 220.

Each group of antennas and/or the area in which they are designated to communicate may be referred to as a sector of base station 202. In one or more aspects, antenna groups each are designed to communicate to mobile devices in a sector or the areas covered by base station 202. A base station may be a fixed station used for communicating with the terminals.

In communication over forward links 218 and 224, the transmitting antennas of base station 202 can utilize beamforming in order to improve a signal-to-noise ratio of forward links for the different mobile devices 216 and 222. Also, a base station utilizing beamforming to transmit to mobile devices scattered randomly through its coverage area might cause less interference to mobile devices in neighboring cells than the interference that can be caused by a base station transmitting through a single antenna to all the mobile devices in its coverage area.

In accordance with some aspects, system 200 can provide a PHICH and PDCCH interleaver structure. The interleaver can provide PHICH inside the PDCCH interleaver. According to some aspects, OFDM symbol based interleaving is provided. Further, system 200 can define control regions in frequency to maximize the separation of CCEs in the frequency domain across OFDM symbols. Some aspects employ bit-reversed interleaving of control regions and some aspects employ random interleaver within the control regions.

Figure 3:
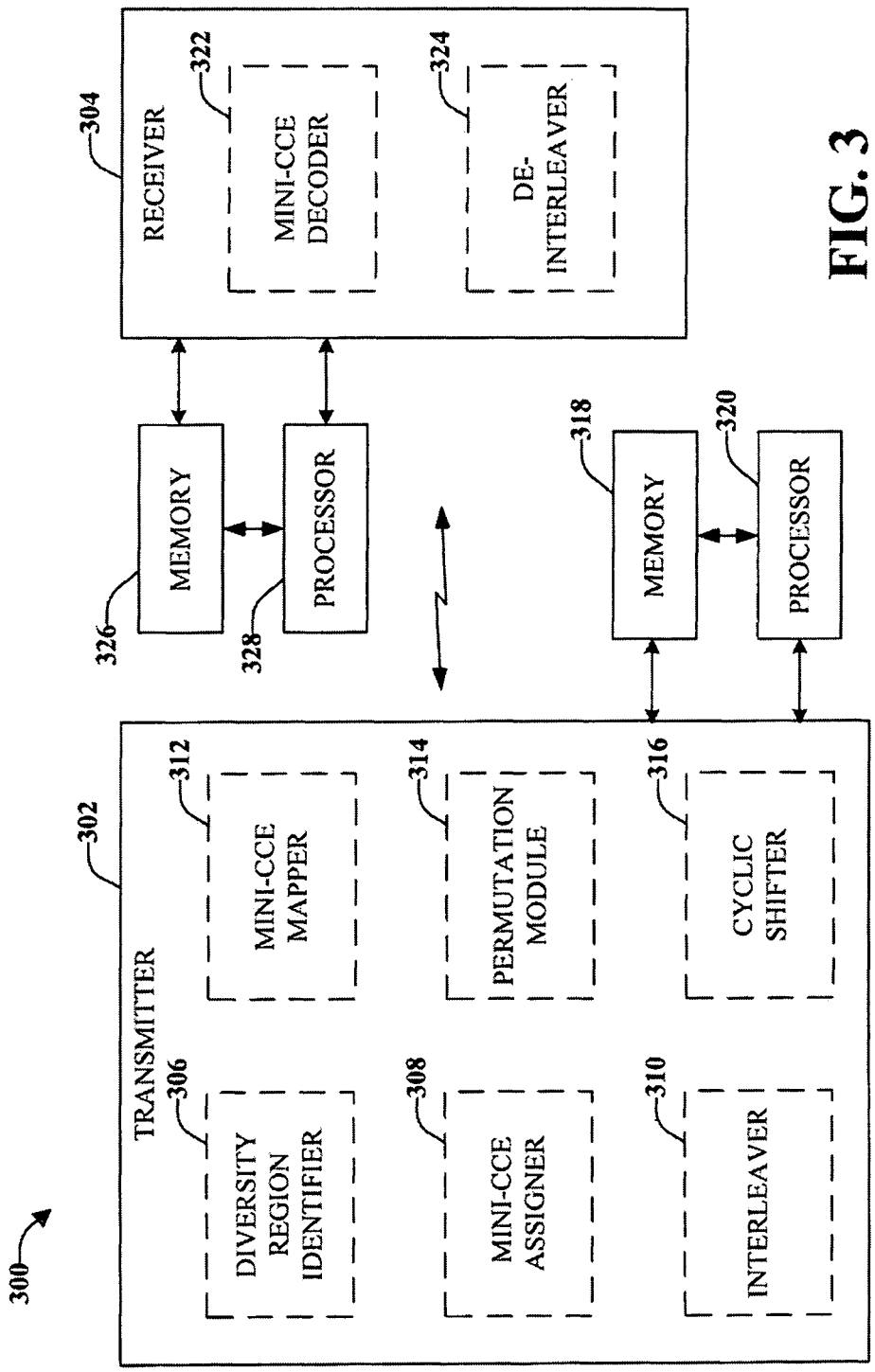
FIG. 3 illustrates a system for enabling frequency diverse control mapping of channel elements to resource elements.

FIG. 3 illustrates a system 300 for enabling frequency diverse control mapping of channel elements to resource elements. Illustrated is a transmitter 302 that is performing data (e.g., voice, data, and so forth) transfer with a receiver 304. Transmitter 302 and/or receiver 304 can be, for example, a base station (e.g., base station 102 of FIG. 1), an access terminal (e.g., access terminal 104 of FIG. 1, access terminal 216, 222 of FIG. 2), or the like. Although a number of transmitter(s) 302 and receiver(s) 304 can be included in system 300, as will be appreciated, a single transmitter 302 that transmits communication data signals with a single receiver 304 is illustrated for purposes of simplicity.

Transmitter 302 is configured to transmit a control channel, which can be a broadcast channel that is sent to multiple receivers 304. The control channels are at the beginning of a message (e.g., subframe) that includes a number of symbols. Thus, for example, the control channels can occupy the first symbol in the message or the first few symbols in the message (e.g., first symbol, second symbol, third symbol, and fourth symbol). The number of control symbols can change from subframe to subframe. The first control symbol can be separated into small fields. One of the small fields within a fixed location (e.g., a selection of one of the small fields) includes information related to the number of control symbols that are utilized in that subframe. The receivers 304 utilize the information from that fixed location to decide how to decode the symbols.

Thus, the receivers 304 know how many control symbols are being utilized but still need to determine the location within the control symbol that might contain information for each receiver 304. Although there can be multiple receivers 304, there might only be a few receivers that are to receive a control symbol in a particular subframe. However, each receiver does not know a priori whether or not a control symbol is intended for that receiver. Thus, all the receivers 304 listen for and attempt to decode the control symbol to determine if the symbol includes information for that particular receiver.

To determine whether there is a message for a particular receiver 304, the receiver 304 calculates a cyclic redundancy check (CRC) and obtains a CRC, located in each message. If the CRC in the message matches the CRC calculated by receiver 304, it indicates there is a message for that receiver 304. If the CRCs do not match, it indicates that there is not a message for that receiver 304 in the current subframe.

The parts of the message that the receivers 304 listen to are overlapping since there are a limited number of control symbols. For example, there could be five receivers 304 attempting to decode the same portion, however there might only be a message sent to one of the receivers 304. Thus, in this example, four receivers 304 would have a decoding failure (e.g., CRCs did not match) and only the target receiver 304 would decode the message successfully (e.g. CRCs matched).

The number of control symbols provides a total number of resource elements. Resource elements are a single tone in a single symbol. For example, each control channel can include a number of resource elements, such as 36 resource elements. Resource elements can be subdivided into control channel elements (CCEs) and mini-CCEs, which are subdivisions of CCEs.

In an example, if there are three symbols and 300 tones, in a two-dimensional array the three symbols can be arranged horizontally (e.g., time) and the 300 tones can be arranged vertically (e.g., frequency). Since there are three symbols, each having 300 tones, there is a total of 900 resource elements (3×300=900), in this example. If the two-dimensional array were physically covered with tiles, each tile representing a single CCE, each CCE would be one symbol in length and 36 tones vertically. The resource element would be the basic unit and within the entire region, the CCEs would be placed, trying to cover the entire region (or as much of the region or two-dimensional array as possible).

Each CCE can carry information for a single receiver 304. However, according to some aspects, aggregation can be utilized, where multiple CCEs can be combined to send a message to a single receiver 304. The receiver 304 does not know a priori the type of aggregation utilized, therefore, the receiver 304 might have to perform decoding a number of different ways to determine which decoding matches the sent information.

Transmitter 302 can be configured to determine how to arrange the CCEs within the total number of resource elements. Transmitter 302 can utilize frequency diversity groups so that the CCEs gain the best possible frequency diversity for the given number of mini-CCEs. Further, a frequency diversity group index is permuted according to a bit reversed scheme so that control channel elements with a small number of mini-CCEs are able to gain sufficient frequency diversity.

Transmitter 302 provides control channel element to resource element (CCE-to-RE) mapping. A control channel element (CCE) is a building block for Physical Downlink Control Channel (PDCCH) (DL L1/L2 control information), which can contain 36 subcarriers. One PDCCH instance can be obtained by concatenation of a number of CCEs (e.g., 1, 2, 4, 8, and so forth) to be able to convey different payload sizes and different coding rates (e.g., aggregation).

The following information should be known by the entity (e.g., transmitter 302, receiver 304) performing the interleaving/deinterleaving as disclosed herein: system bandwidth; existence of third and fourth antenna and all Reference Signal (RS) locations; location of Physical Control Format Indicator Channel (PCFICH) tones; number of PHICH mini-CCEs; PHICH time duration; PDCCH symbol span (for PDCCH). In accordance with some aspects, provided is frequency diversity for the PHICH and PDCCH CCEs. The disclosed aspects can help achieve systematically beneficial diversity. The order in which the functions within transmitter 302 (and receiver 304) are executed can vary. For example, a similar end-to-end permutation can be achieved by changing each of the component permutations and changing the order in which the permutations are performed. Therefore, in this detailed description, the order in which various steps are described does not necessarily correspond to the order in which the steps can be performed.

Transmitter 302 includes a diversity region identifier 306 that is configured to define diversity regions across the system bandwidth. Each diversity region is a distinct set of resource elements. Together, the diversity regions cover the entire system bandwidth, or close to the entire system bandwidth. In an example, the number of diversity regions is set to a power of two, which can enable a bit reversed interleaving of the diversity regions. For the power of two example, the following table illustrates the system bandwidth and the number of regions available.

TABLE 1

| System Bandwidth | Number of Regions |
| --- | --- |
| 1.4 MHz | 4 regions |
| 3.0 MHz | 8 regions |
| 5.0 MHz | 16 regions |
| 10 MHz | 32 regions |
| 15 MHz | 64 regions |
| 20 MHz | 64 regions |

Also included in transmitter 302 is a mini-CCE assigner 308 that is configured to bin (e.g., put together, list) all available mini-CCEs to the diversity regions. The unavailability of RS and Physical Control Format Indicator Channel (PC-FICH) tones should be considered by the mini-CCE assigner 308. Although it is not always possible to have an equal number of resource elements in all diversity regions, the mini-CCE assigner 308 attempts to ensure that the difference in the number of participant resource elements is at most about one mini-CCE size among all diversity regions. Further mini-CCE assigner 308 does not consider PHICH duration or the number of PHICH CCEs. In accordance with some aspects, mini-CCE assigner 308 can fill the diversity regions one by one with consecutive (in frequency) mini-CCEs starting from the highest frequency to the lowest frequency. The mapping is performed in each control symbol independently.

An interleaver 310 is configured to bit-reverse interleave the diversity region indices. In accordance with some aspects, the interleaving is OFDM symbol based. In order to fully appreciate the disclosed aspects, FIG. 4 and FIG. 5 illustrate mapping with and without bit reversed interleaving.

Figure 4:
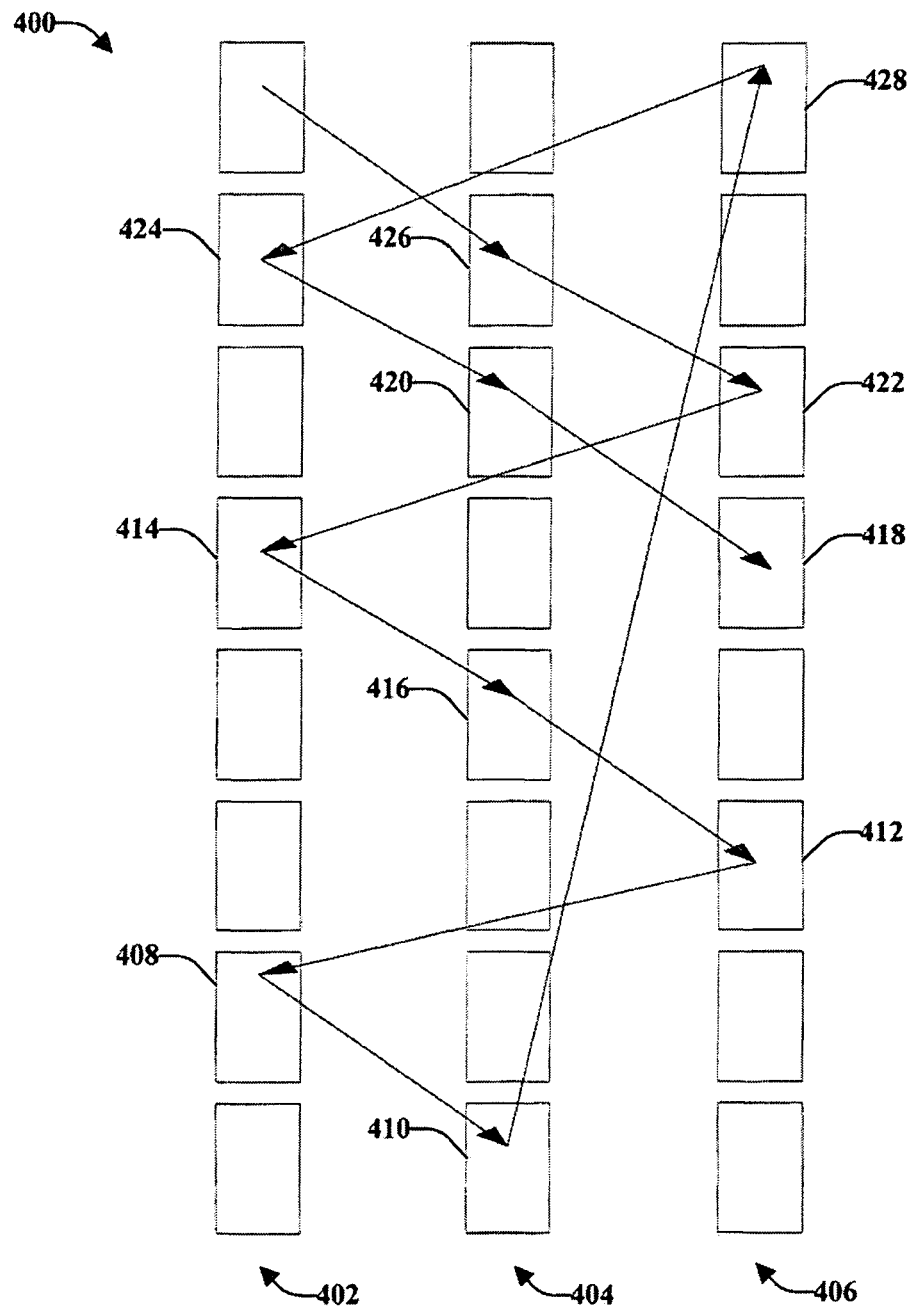
FIG. 4 illustrates an example mapping without bit reversed interleaving.

FIG. 4 illustrates an example mapping 400 without bit reversed interleaving. The example mapping 400 is a two-dimensional array. Illustrated are three symbols along the horizontal axis, labeled symbol 402, symbol 404, and symbol 406. Along the vertical axis are eight diversity regions. As illustrated, without bit reversed interleaving, the eleven mini-CCEs are mapped as indicated. For example, the mini-CCEs can be mapped at locations, 408, 410, 412, 414, 416, 418, 420, 422, 424, 426 and 428. It should be remembered that the illustrated mapping 400 is an example only and mappings other than the illustrated mapping can be derived without bit reversed interleaving.

Figure 5:
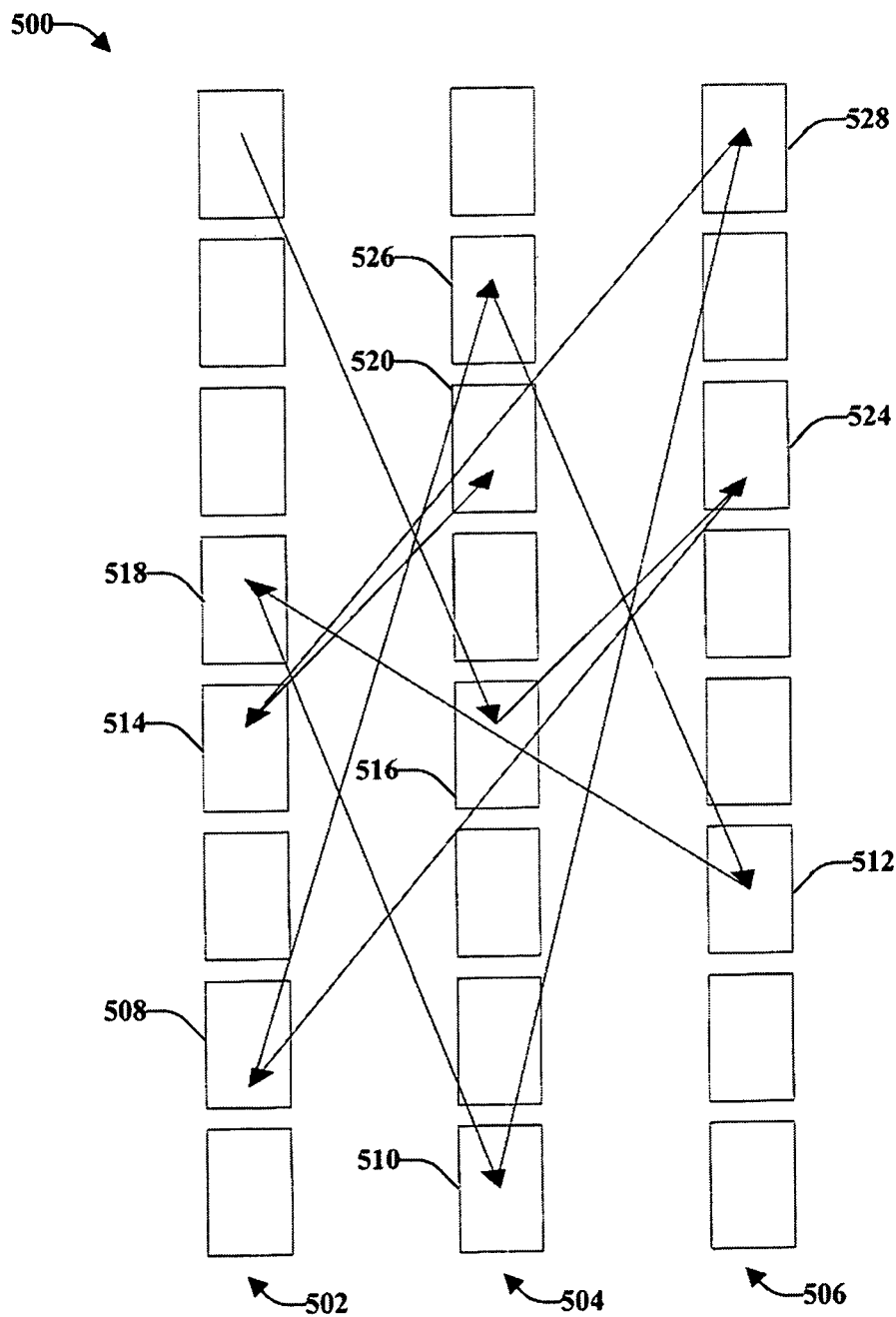
FIG. 5 illustrates an example mapping with bit reversed interleaving, according to an aspect.

FIG. 5 illustrates an example mapping 500 with bit reversed interleaving, according to an aspect. Similar to the above figure, the example mapping 500 is a two-dimensional array having three symbols along the horizontal axis, labeled symbol 502, symbol 504, and symbol 506. Along the vertical axis are eight diversity regions. As illustrated, with bit reversed interleaving, the eleven mini-CCEs are mapped, for example, at locations, 508, 510, 512, 514, 516, 518, 520, 522, 524, 526 and 528. Note that a bit-reversed interleaving of a sequence of eight diversity groups, numbered {0, 1, 2, ... 7}, results in an interleaved sequence of {0, 4, 2, 6, 1, 5, 3, 7} as can be seen in FIG. 5 by following the sequence of consecutive diversity group indices.

With reference again to FIG. 3, a mini-CCE mapper 312 is configured to map the PHICH mini-CCEs to the already binned physical mini-CCE locations (as determined by mini-CCE assigner 308). In accordance with some aspects, the mapping is performed sequentially, in a "cyclic diagonal" fashion. For example purposes and not limitation, assuming a three-symbol PHICCH, the first mini-CCE is mapped to the first symbol's first diversity region. The second mini-CCE is mapped to the second symbol's second diversity region. The third min-CCE is mapped to the third symbol's third diversity region. The fourth mini-CCE is mapped to the first symbol's fourth diversity region, and so forth. In each diversity region, the first available mini-CCE from a list generated by mini-CCE assigner 308 is utilized. It should be noted that the diversity regions indices are taken after the index interleaving performed by interleaver 310.

Mini-CCE mapper 312 further maps the PDCCH mini-CCEs to the already binned physical mini-CCE locations. This can be performed sequentially, in a "cyclic diagonal" fashion, as described above. However, in this case, only the leftover mini-CCEs are utilized (e.g., after mapping the PHICH mini CCEs). The symbol duration for the PHICH and PDCCH, in general, can be different. With reference again to FIG. 4, illustrated is the result of a mapping in a "cyclic diagonal" fashion without bit-reversed interleaving performed. FIG. 5, on the other hand, illustrates the results of a mapping in a "cyclic diagonal" fashion in combination with a bit-reversed interleaving of the diversity group.

A permutation module 314 is configured to randomly permute the elements in each diversity group. The random permutation can be performed by permutation module 314 in each control symbol independently. Further, the permutation is performed independently of which mini-CCEs are actually used (e.g., since some mini-CCEs might not be utilized in a current subframe).

In accordance with some aspects, a generic random permutation can be applied by permutation module 314, which can be an intra diversity group permutation. A permutation in an iterative manner can be built according to the following. Let $\sigma_n$ be the permutation corresponding to length n. To obtain $\sigma_{n+1}$ the following can be performed. First, generate a random integer $r_{n+1}$ uniformly distributed over 1 ... n+1. If $r_{n+1}=n+1$, modify $\sigma_n$ as $\sigma_{n+1}(n+1)=n+1$. If $r_{n+1} \neq n+1$, modify $\sigma_n$ as $\sigma_{n+1}(r_{n+1})=n+1$ and $\sigma_{n+1}(n+1)=\sigma_n(r_{n+1})$. For example:

| | | | | | | | | |
|---|---|---|---|---|---|---|---|---|
| $\sigma_5$: | 2 | 4 | 1 | 5 | 3 | | | |
| $\sigma_6$: | 6 | 4 | 1 | 5 | 3 | 2 | if | $r_6 = 1$ |
| $\sigma_6$: | 2 | 6 | 1 | 5 | 3 | 4 | if | $r_6 = 2$ |
| $\sigma_6$: | 2 | 4 | 6 | 5 | 3 | 1 | if | $r_6 = 3$ |
| $\sigma_6$: | 2 | 4 | 1 | 6 | 3 | 5 | if | $r_6 = 4$ |
| $\sigma_6$: | 2 | 4 | 1 | 5 | 6 | 3 | if | $r_6 = 5$ |
| $\sigma_6$: | 2 | 4 | 1 | 5 | 3 | 6 | if | $r_6 = 6$ |

An advantage of utilizing an intra diversity group permutation construction as described is that blocks of data in memory do not have to be moved at every iterative step. Each iteration step takes only one memory read and two memory writes. Further, there is no other integer arithmetic involved, except for the $r_{n+1}$ random generation. Permutations of any length can be generated utilizing the generic random permutation described and the probability of the resulting permutation is uniformly $((n+1)!)^{-1}$.

In accordance with some aspects, a random number generator is utilized. For example, an aspect can be based on m-sequences and there is a length-12 m sequence generator, which can be shifted by one each time a new random number is generated. Then, $b_n$ LSB bits of the shift register content are taken and $r_n$ is calculated as $r_n=\mod(m(b_n),n)$ where $m(b_n)$ is the integer represented by the $b_n$ LSB bits. Further, $b_n$ can be any integer number between $b_n=\lceil \log_2(n+1) \rceil+1$ and 12, where $\lceil x \rceil$ represents the smallest integer greater than or equal to x. In accordance with some aspects, to minimize the complexity of the modulo n operation, $b_n=\lceil \log_2(n+1) \rceil+1$ can be utilized.

It should be understood that other random number generation means can be utilized with the disclosed aspects. However, it should be noted that improved randomization can be achieved if the values read from the shift register are interleaved and the described example interleaver is a very short length-12 interleaver. For example, a simple interleaver with an offset factor relative prime to 12 could be utilized.

Additionally or alternatively, for different cells, different initial states of the shirt registers can be assumed. These different initial states can be derived by utilizing a 9-bit Cell_ID after zero padding as the initial state of the shift register. However, this is an example only and different means of determining an initial state of the shift register can be utilized with the disclosed aspects. A cyclic shifter 316 applies cell dependent cyclic shift in the frequency domain in each symbol. The mini-CCEs are mapped to the resource elements.

In accordance with some aspects, one of the symbols might initially have a higher load than the other symbols due to RS tones. Thus, since one symbol has an initial higher load, the power of the symbols cannot be equalized as discussed. For this situation, the RS+PCFICH tones can be counted in the symbol with the highest initial power. Then, when allocating the PDCCH tones, the other symbols are utilized (not the symbol with the highest initial power). Once the number of counted tones is reached, the power of the control symbols are about the same. At this point, the PDCCH mini-CCEs can be uniformly distributed over the symbols so that utilization of the power can be made more uniform across the control symbols.

A similar method can be applied consecutively in a "water filling" fashion if there are three or more initial power levels. This means that the mini-CCEs are distributed evenly in the lowest power utilized symbol (or symbols) until the tone count in each of those symbols reaches the level of symbol with the next highest power utilization level. Then the mini-CCEs are distributed in that expanded set of symbols evenly until the tone count reaches the next higher level, and so on.

System 300 can include memory 318 operatively coupled to transmitter 302. Memory 318 can be external to transmitter 302 or can reside within transmitter 302. Memory 318 can store information related to establishing a mapping between available mini-CCEs and diversity regions in accordance with the disclosed aspects and other suitable information related to signals transmitted and received in a communication network. Memory 318 can store protocols associated with frequency diverse control mapping, taking action to control communication between transmitter 302 and receiver 304, and so forth, such that system 300 can employ stored protocols and/or algorithms to achieve improved communications in a wireless network as described herein.

A processor 320 can be operatively connected to transmitter 302 (and/or memory 318) to facilitate analysis of information related to frequency diverse control mapping of channel elements to resource elements in a communication network Processor 320 can be a processor dedicated to analyzing and/or generating information received by transmitter 302, a processor that controls one or more components of system 300, and/or a processor that both analyzes and generates information received by transmitter 302 and controls one or more components of system 300.

It should be appreciated that the data store (e.g., memories) components described herein can be either volatile memory or nonvolatile memory, or can include both volatile and non-volatile memory. By way of example and not limitation, non-volatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of example and not limitation, RAM is available in many forms such as synchronous RAM (DRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the disclosed aspects are intended to comprise, without being limited to, these and other suitable types of memory.

Receiver 304 can include a mini-CCE decoder 322 that is configured to determine a starting location of the mini-CCE(s) intended for the receiver 304. In accordance with some aspects, receiver 304 can utilize a process similar to the process utilized by transmitter 302 to map the mini-CCEs. Also included in receiver 304 is a de-interleaver 324 that is configured to de-interleave the mapping.

System 300 can include memory 326 operatively coupled to receiver 304. Memory 326 can be external to receiver 304 or can reside within receiver 304. Memory 326 can store information related to decoding a mapping between available mini-CCEs and diversity regions in accordance with the disclosed aspects. Memory 326 can also store other suitable information related to signals transmitted and received in a communication network. Memory 326 can store protocols associated with frequency diverse control mapping, taking action to control communication between transmitter 302 and receiver 304, and so forth, such that system 300 can employ stored protocols and/or algorithms to achieve improved communications in a wireless network as described herein.

A processor 328 can be operatively connected to receiver 304 (and/or memory 326) to facilitate analysis of information related to frequency diverse control mapping of channel elements to resource elements in a communication network. Processor 328 can be a processor dedicated to analyzing and/or generating information received by receiver 304, a processor that controls one or more components of system 300, and/or a processor that both analyzes and generates information received by receiver 304 and controls one or more components of system 300.

In view of the exemplary systems shown and described above, methodologies that may be implemented in accordance with the disclosed subject matter, will be better appreciated with reference to the following flow charts. While, for purposes of simplicity of explanation, the methodologies are shown and described as a series of blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement the methodologies described herein. It is to be appreciated that the functionality associated with the blocks may be implemented by software, hardware, a combination thereof or any other suitable means (e.g. device, system, process, component). Additionally, it should be further appreciated that the methodologies disclosed hereinafter and throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

Figure 6:
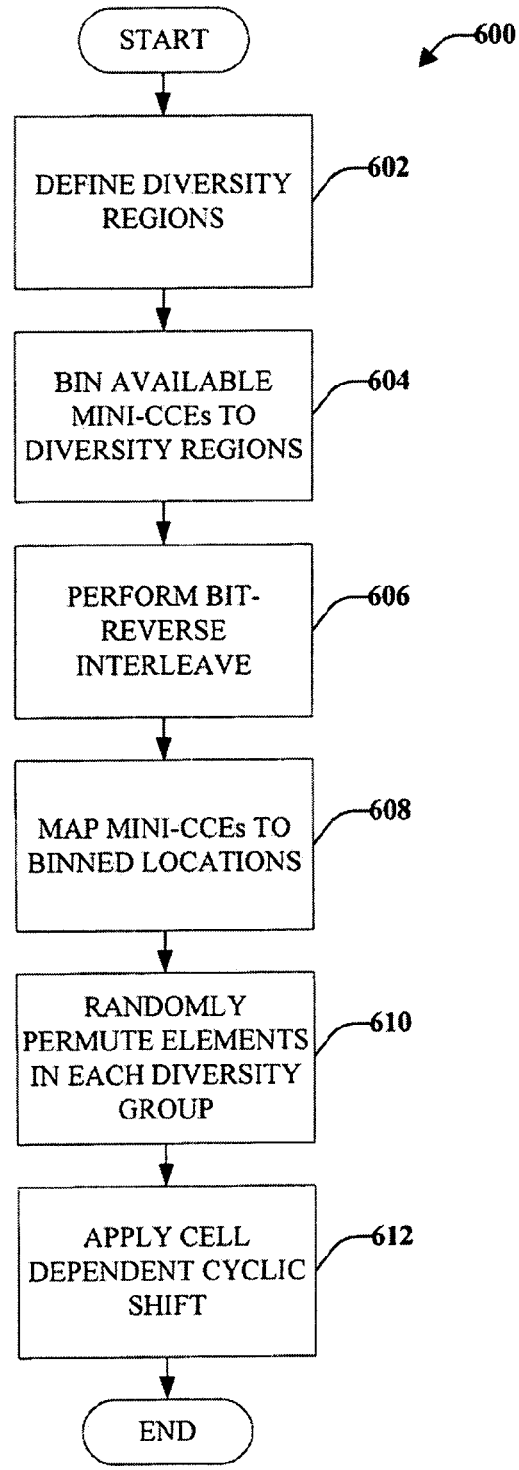
FIG. 6 illustrates a method for mapping mini-CCEs to resource elements to enable frequency diverse control mapping in accordance with an aspect.

FIG. 6 illustrates a method 600 for mapping mini-CCEs to resource elements to enable frequency diverse control mapping in accordance with an aspect. Method 600 can provide a distribution over diversity groups, wherein the distribution is better than conventional techniques due to bit reversed diversity group indexing and symbol dependent mini-CCE to diversity group mapping.

Method 600 starts, at 602, when diversity regions are defined across the communication network (e.g., system) bandwidth. The diversity regions should cover as much of the network bandwidth as possible. In accordance with some aspects, the number of diversity regions can be set a power of two, which can enable a bit reversed interleaving of the diversity regions. In an example, a 1.4 MHz system can have four diversity regions. A 3 MHz system can have eight diversity regions. A 5 MHz system can have sixteen diversity regions. A 10 MHz system can have thirty-two diversity regions. In a 15 MHz system and a 20 MHz system, there can be sixty-four diversity regions.

The available mini-CCEs are put together (or binned), at 604, to the defined diversity regions. The diversity regions can be filled one by one with consecutive (in frequency) mini-CCEs. For example, the diversity regions can be filled one by one starting from the highest frequency to the lowest frequency. However, other means of filling the diversity regions can be utilized with the disclosed aspects. At times, it might not be possible to have an equal number of resource elements in all diversity regions. However, the difference in the number of participant resource elements can be kept to about the size of one mini-CCE among the diversity regions.

At 606, bit-reverse interleaving is performed on the diversity region indices. As noted above, bit reversed interleaving can be enabled when the number of diversity regions is a power of two. In accordance with some aspects, the bit reversed interleaving can be performed by iteratively adding new elements in a permutation cyclic structure. However, it should be understood that other means of performing bit reversed interleaving can be performed with the disclosed aspects.

After performing the bit-reverse interleave on the diversity region indices, the PHICH mini-CCEs are mapped to the binned physical mini-CCE locations, at 608. After mapping the PHICH mini-CCEs, the PDCCH mini-CCEs are mapped to the binned physical mini-CCE locations (e.g., only the leftover mini-CCEs are utilized). The mapping of the PHICH mini-CCES and the PDCCH mini-CCEs can be performed sequentially, such as in a "cyclic diagonal" manner, according to an aspect.

By way of example and not limitation, the cyclic diagonal manner of mapping the mini-CCEs will be described, assuming a three-symbol PHICH. To start, the first mini-CCE is mapped to the first symbol's first diversity region. Then the second mini-CCE is mapped to the second symbol's second diversity region and the third mini-CCE is mapped to the third symbol's third diversity region. Next, the fourth mini-CCE is mapped to the first symbol's fourth diversity region, and so on. Thus, in each diversity region, the first available mini-CCE from the list generated, at 604, is utilized.

At 610, the elements in each diversity group are randomly permuted in each control symbol independently. The random permutation is performed independently of which mini-CCEs are actually utilized.

A cell dependent cyclic shift in the frequency domain is applied in each symbol, at 612. Method 600 can also provide independent permutation within each diversity group, which can mitigate the collisions across base stations. The independent permutation within each diversity group can be provided by making the permutation cell_ID dependent, irrespective of the cyclic shift applied, at 612. This mapping can be utilized to map mini-CCES to resource elements.

Figure 7:
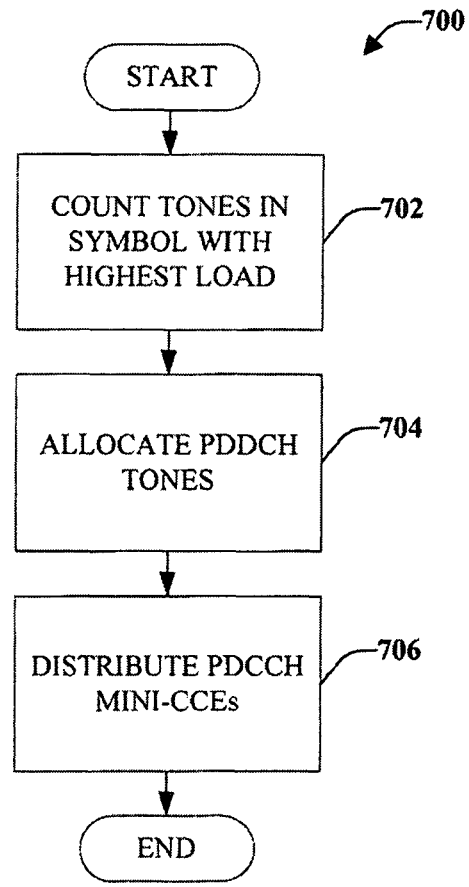
FIG. 7 illustrates a method for equalizing power across symbols, according to an aspect.

FIG. 7 illustrates a method 700 for equalizing power across symbols, according to an aspect. There might be situations where one symbol initially has a higher load prior to the mapping (which was discussed with reference to FIG. 6 above). In theses situations, method 700 can be utilized so that the transmitter's (e.g., base station's) power can be closer to uniform across the control symbols.

For example purposes, a 5 MHZ system with 300 frequency tones will be discussed, assuming there are three symbols allocated for control. In this example, after excluding the RS tones for two base station antennas, there are 200 tones (50 mini-CCEs) remaining in the first symbol, 300 tones remaining in the second symbol and 300 tones remaining in the third symbol. It should be noted that the indicated remaining tones in this example is not completely accurate (e.g., would be less than 200 or 300 tones) due to the PCFICH, however, this is ignored for example purposes only. Thus, even though the PDCCH mapping attempts to distribute the PDCCH power uniformly over the three symbols, the power is not uniform. This is due to the fact that the first symbol had a higher load already (e.g., only 200 tones remaining) at the beginning due to the presence of the RS tones and, thus, after mapping in accordance with the disclosed aspects, the power in the three symbols will not be equalized. Thus, method 700 can be utilized to attempt to more equally distribute the power by compensating for the initial power disparity.

Method 700 starts, at 702, where the tones in the symbol with the highest initial load are counted. The tones that are counted are the Reference Signal and Physical Control Format Indicator Channel (RS+PCFICH) tones. In the above example, the symbol with the highest initial load was the first symbol and the RS+PCFICH tones is equal to 100 tones.

At 704, the PDCCH tones are allocated utilizing the symbols other than the symbol with the highest initial load (e.g., not utilizing the symbol with the highest initial load). In the above example, the first 200 PDCCH tones (e.g., 50 mini-CCEs) are allocated utilizing only the second and third control symbols (since the first symbol in the example had the highest initial load). The PDCCH tones are allocated until the number of allocated PDCCH tones equals the number of tones counted (RS+PCFICH tones), at 702 above.

Once the specified number of PDCCH tones are consumed (200 tones in the above example), the power in the symbols are about even in number. Thus, at 706, the PDCCH mini-CCEs are uniformly distributed over all the symbols (e.g. three symbols in the above example). In this manner, the utilization of the base station power can be made more uniform across the control symbols.

Figure 8:
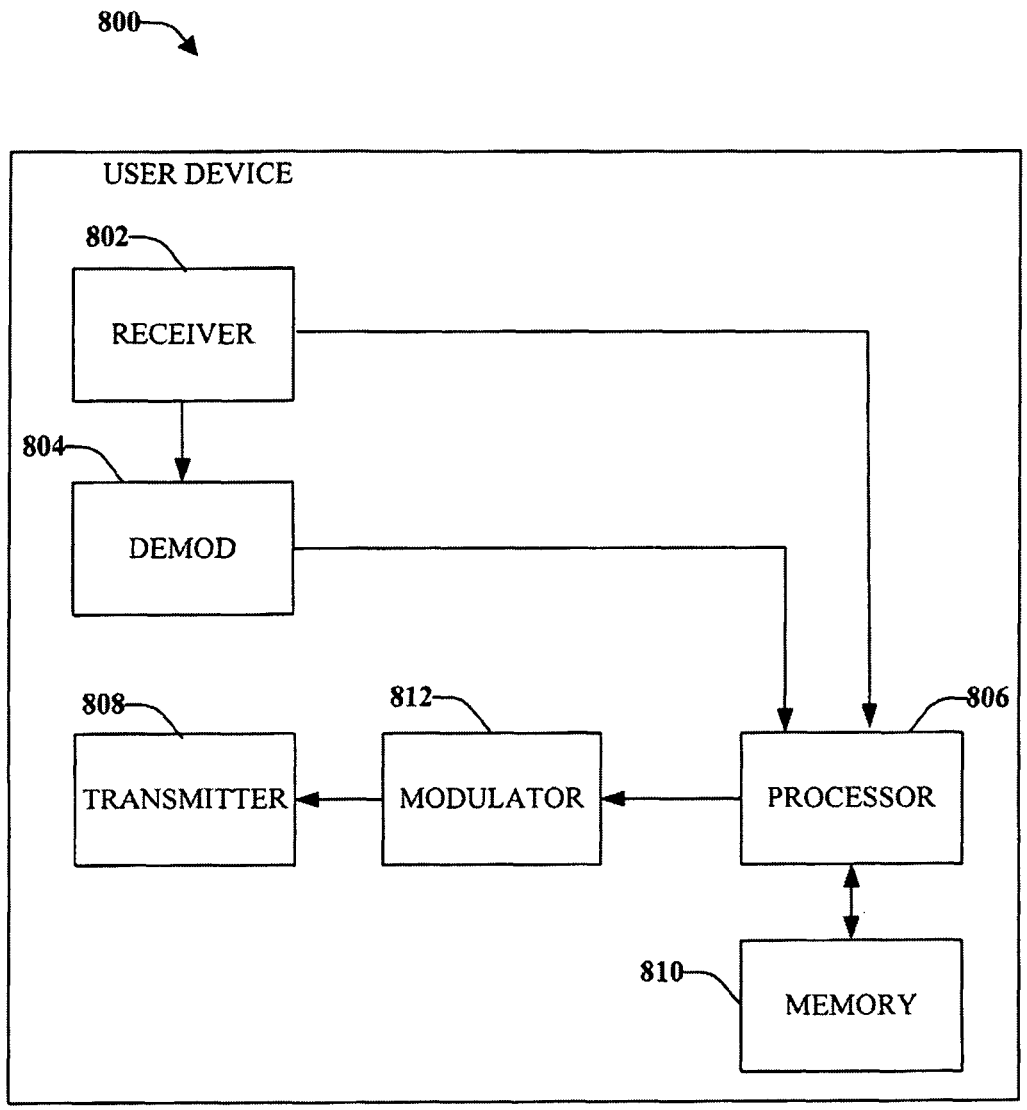
FIG. 8 illustrates a system that facilitates mapping mini-control channel elements to resource elements in accordance with one or more of the disclosed aspects.

With reference now to FIG. 8, illustrated is a system 800 that facilitates mapping mini-control channel elements to resource elements in accordance with one or more of the disclosed aspects. System 800 can reside in a user device. System 800 comprises a receiver 802 that can receive a signal from, for example, a receiver antenna. The receiver 802 can perform typical actions thereon, such as filtering, amplifying, downconverting, etc. the received signal. The receiver 802 can also digitize the conditioned signal to obtain samples. A demodulator 804 can obtain received symbols for each symbol period, as well as provide received symbols to a processor 806.

Processor 806 can be a processor dedicated to analyzing information received by receiver component 802 and/or generating information for transmission by a transmitter 808. In addition or alternatively, processor 806 can control one or more components of user device 800, analyze information received by receiver 802, generate information for transmission by transmitter 808, and/or control one or more components of user device 800. Processor 806 may include a controller component capable of coordinating communications with additional user devices.

User device 800 can additionally comprise memory 808 operatively coupled to processor 806 and that can store information related to coordinating communications and any other suitable information. Memory 810 can additionally store protocols associated with frequency diverse control mapping. It will be appreciated that the data store (e.g., memories) components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ES-DRAM), Synchlink DRAM (SLDRAM), and direct Rambus RAM (DRRAM). The memory 808 of the subject systems and/or methods is intended to comprise, without being limited to, these and any other suitable types of memory. User device 800 can further comprise a symbol modulator 812 and a transmitter 808 that transmits the modulated signal.

Figure 9:
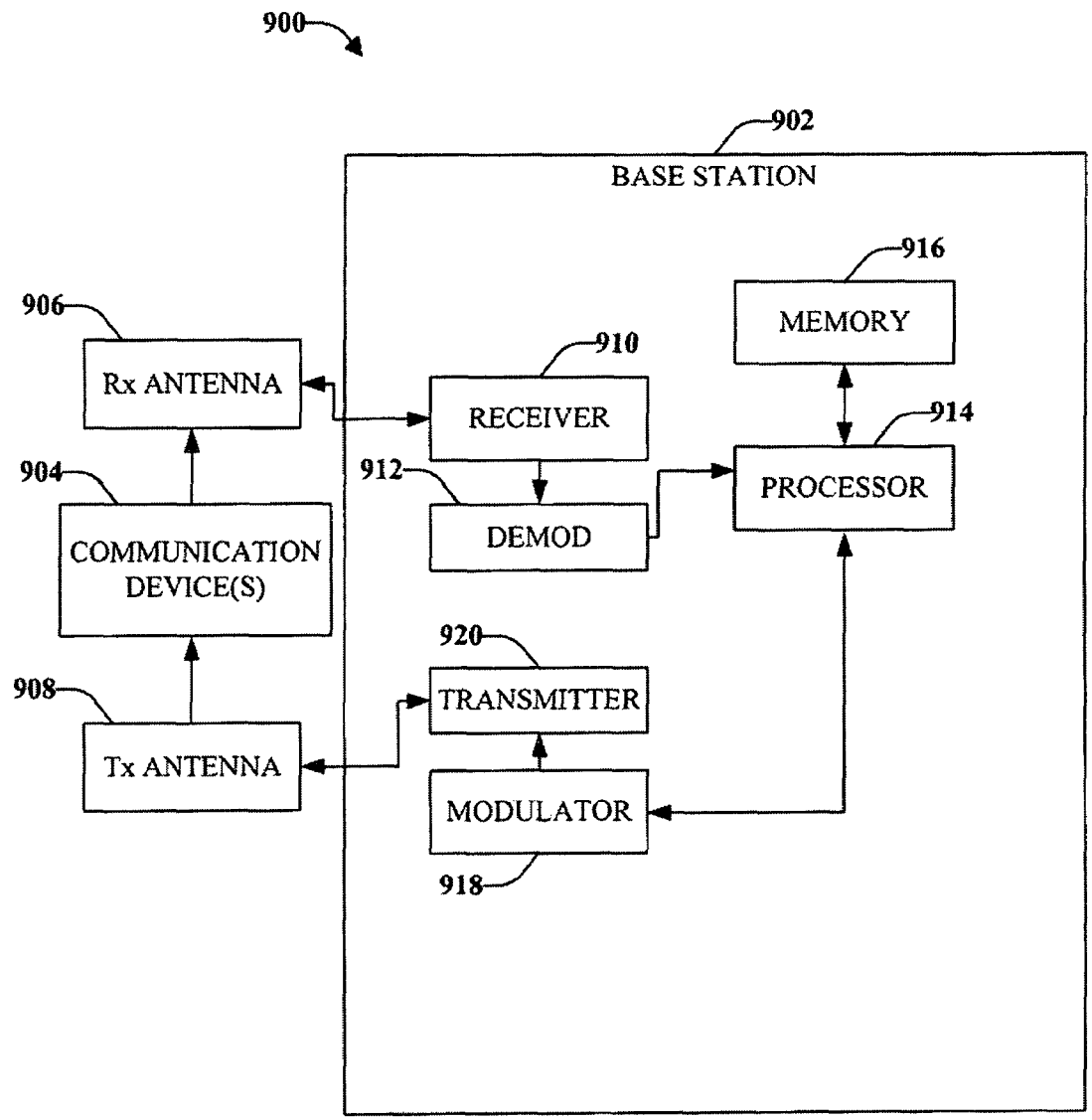
FIG. 9 illustrates a system that facilitates frequency diverse control mapping of channel elements to resource elements in accordance with various aspects presented herein.

FIG. 9 illustrates a system 900 that facilitates frequency diverse control mapping of channel elements to resource elements in accordance with various aspects presented herein. System 900 comprises a base station or access point 902. As illustrated, base station 902 receives signal(s) from one or more communication devices 904 (e.g., user device) by a receive antenna 906, and transmits to the one or more communication devices 904 through a transmit antenna 908.

Base station 902 comprises a receiver 910 that receives information from receive antenna 906 and is operatively associated with a demodulator 912 that demodulates received information. Demodulated symbols are analyzed by a processor 914 that is coupled to a memory 916 that stores information related to mapping mini-control channel elements to resource elements. A modulator 918 can multiplex the signal for transmission by a transmitter 920 through transmit antenna 908 to communication devices 904.

Figure 10:
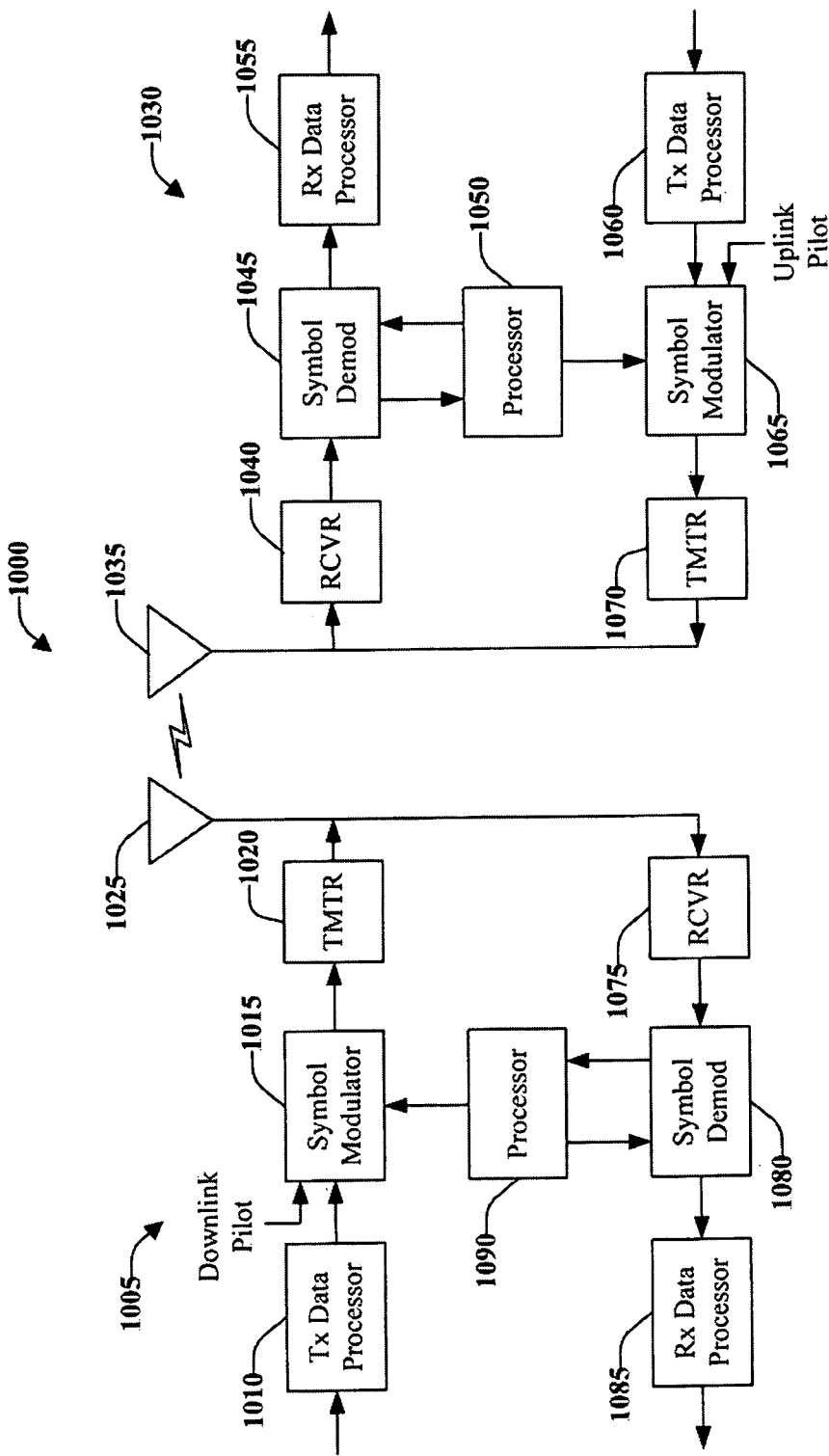
FIG. 10 illustrates an exemplary wireless communication system, according to various aspects.

FIG. 10 illustrates an exemplary wireless communication system 1000, according to various aspects. Wireless communication system 1000 depicts one base station and one terminal for sake of brevity. However, it is to be appreciated that system 1000 can include more than one base station or access point and/or more than one terminal or user device, wherein additional base stations and/or terminals can be substantially similar or different from the exemplary base station and terminal described below. In addition, it is to be appreciated that the base station and/or the terminal can employ the systems and/or methods described herein to facilitate wireless communication there between.

Referring now to FIG. 10, on a downlink, at access point 1005, a transmit (TX) data processor 1010 receives, formats, codes, interleaves, and modulates (or symbol maps) traffic data and provides modulation symbols ("data symbols"). A symbol modulator 1015 receives and processes the data symbols and pilot symbols and provides a stream of symbols. A symbol modulator 1015 multiplexes data and pilot symbols and obtains a set of N transmit symbols. Each transmit symbol may be a data symbol, a pilot symbol, or a signal value of zero. The pilot symbols may be sent continuously in each symbol period. The pilot symbols can be frequency division multiplexed (FDM), orthogonal frequency division multiplexed (OFDM), time division multiplexed (TDM), frequency division multiplexed (FDM), or code division multiplexed (CDM).

A transmitter unit (TMTR) 1020 receives and converts the stream of symbols into one or more analog signals and further conditions (e.g., amplifies, filters, and frequency upconverts) the analog signals to generate a downlink signal suitable for transmission over the wireless channel. The downlink signal is then transmitted through an antenna 1025 to the terminals. At terminal 1030, an antenna 1035 receives the downlink signal and provides a received signal to a receiver unit (RCVR) 1040. Receiver unit 1040 conditions (e.g., filters, amplifies, and frequency downconverts) the received signal and digitizes the conditioned signal to obtain samples. A symbol demodulator 1045 obtains N received symbols and provides received pilot symbols to a processor 1050 for channel estimation. Symbol demodulator 1045 further receives a frequency response estimate for the downlink from processor 1050, performs data demodulation on the received data symbols to obtain data symbol estimates (which are estimates of the transmitted data symbols), and provides the data symbol estimates to an RX data processor 1055, which demodulates (i.e., symbol demaps), deinterleaves, and decodes the data symbol estimates to recover the transmitted traffic data. The processing by symbol demodulator 1045 and RX data processor 1055 is complementary to the processing by symbol modulator 1015 and TX data processor 1010, respectively, at access point 1005.

On the uplink, a TX data processor 1060 processes traffic data and provides data symbols. A symbol modulator 1065 receives and multiplexes the data symbols with pilot symbols, performs modulation, and provides a stream of symbols. A transmitter unit 1070 then receives and processes the stream of symbols to generate an uplink signal, which is transmitted by the antenna 1035 to the access point 1005.

At access point 1005, the uplink signal from terminal 1030 is received by the antenna 1025 and processed by a receiver unit 1075 to obtain samples. A symbol demodulator 1080 then processes the samples and provides received pilot symbols and data symbol estimates for the uplink. An RX data processor 1085 processes the data symbol estimates to recover the traffic data transmitted by terminal 1030. A processor 1090 performs channel estimation for each active terminal transmitting on the uplink.

Processors 1090 and 1050 direct (e.g., control, coordinate, manage, . . . ) operation at access point 1005 and terminal 1030, respectively. Respective processors 1090 and 1050 can be associated with memory units (not shown) that store program codes and data. Processors 1090 and 1050 can also perform computations to derive frequency and impulse response estimates for the uplink and downlink, respectively.

For a multiple-access system (e.g., FDMA, OFDMA, CDMA, TDMA, and the like), multiple terminals can transmit concurrently on the uplink. For such a system, the pilot subbands may be shared among different terminals. The channel estimation techniques may be used in cases where the pilot subbands for each terminal span the entire operating band (possibly except for the band edges). Such a pilot subband structure would be desirable to obtain frequency diversity for each terminal. The techniques described herein may be implemented by various means. For example, these techniques may be implemented in hardware, software, or a combination thereof. For a hardware implementation, the processing units used for channel estimation may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. With software, implementation can be through modules (e.g., procedures, functions, and so on) that perform the functions described herein. The software codes may be stored in memory unit and executed by the processors 1090 and 1050.

Figure 11:
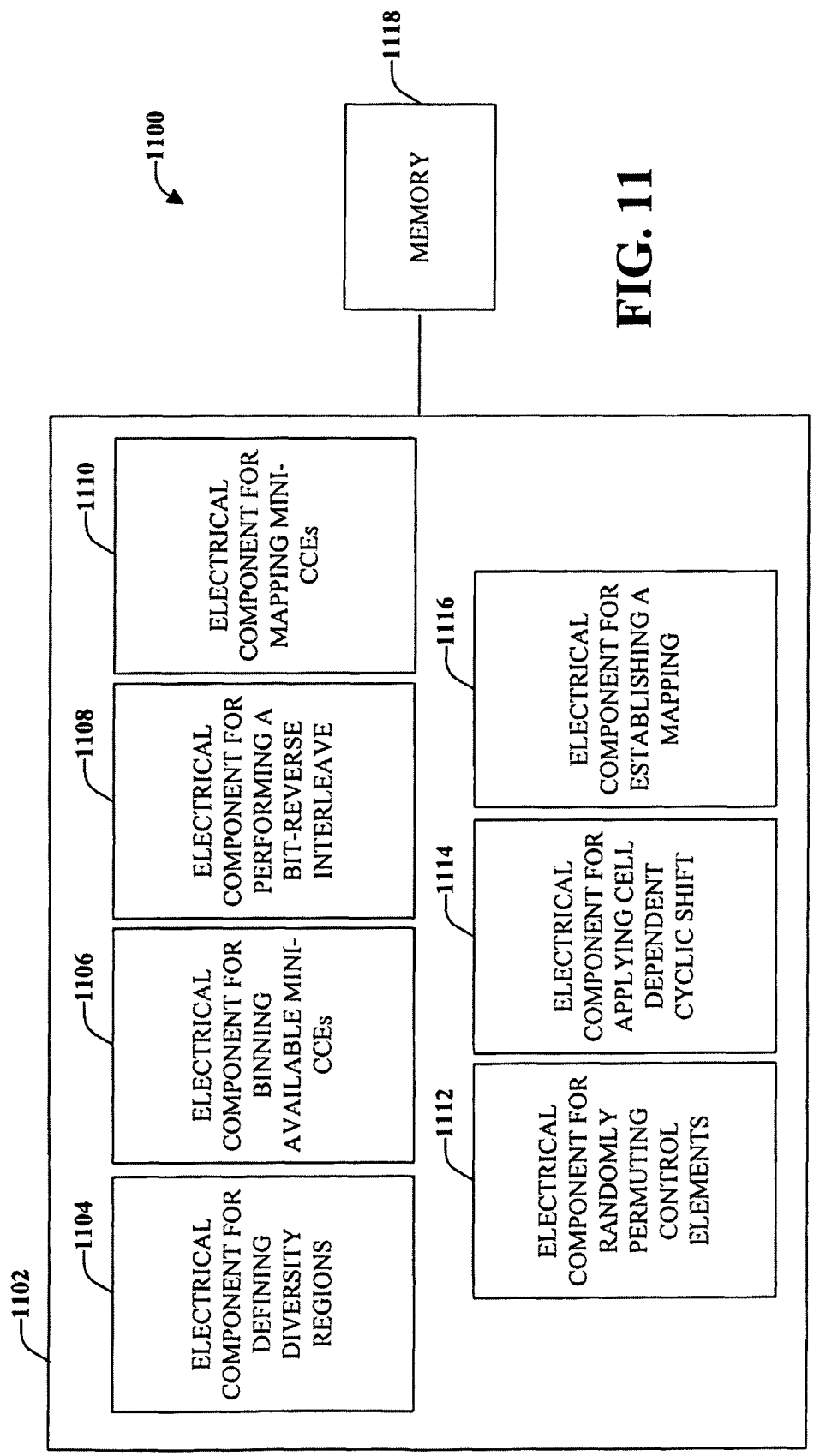
FIG. 11 illustrates an example system that enables frequency diversity, according to an aspect.

With reference to FIG. 11, illustrated is an example system 1100 that enables frequency diversity, according to an aspect. System 1100 is represented as including functional blocks, which may be functional blocks that represent functions implemented by a processor, software, or combination thereof (e.g., firmware).

System 1100 includes a logical grouping 1102 of electrical components that can act separately or in conjunction. Logical grouping 1102 can include an electrical component 1104 for defining diversity regions across a network bandwidth. The diversity regions can be defined separately for each symbol. Also included in logical grouping 1102 is an electrical component 1106 for binning available mini-control channel elements to the defined diversity regions and an electrical component 1108 for performing a bit-reverse interleave on diversity region indices. According to some aspects, performing a bit-reverse interleave comprises iteratively adding elements in a permutation cycle structure.

Logical grouping 1102 also includes an electrical component 1110 for mapping the mini-control channel elements to the binned diversity regions. In accordance with some aspects, PHICH mini-CCEs are mapped before mapping PDICH mini-CCEs. Also included is an electrical component 1112 for randomly permuting the control elements in each diversity region. According to some aspects, randomly permuting control elements in each diversity region is performed in each control symbol independently. According to some aspects, randomly permuting control elements in each diversity region is performed independently of whether one or more mini-CCEs are used.

Further, logical grouping 1102 includes an electrical component 1114 for applying cell dependent cyclic shift in the frequency domain and an electrical component 1116 for establishing a mapping between available mini-control channel elements and resource elements. In accordance with some aspects, frequency diversity is enabled for PHICH resource allocation and PDCCH allocation.

Additionally, system 1100 can include a memory 1118 that retains instructions for executing functions associated with electrical components 1104, 1106, 1108, 1110, 1112, 1114, and 1116 or other components. While shown as being external to memory 1118, it is to be understood that one or more of electrical components 1104, 1106, 1108, 1110, 1112, 1114, and 1116 can exist within memory 1118.

Figure 12:
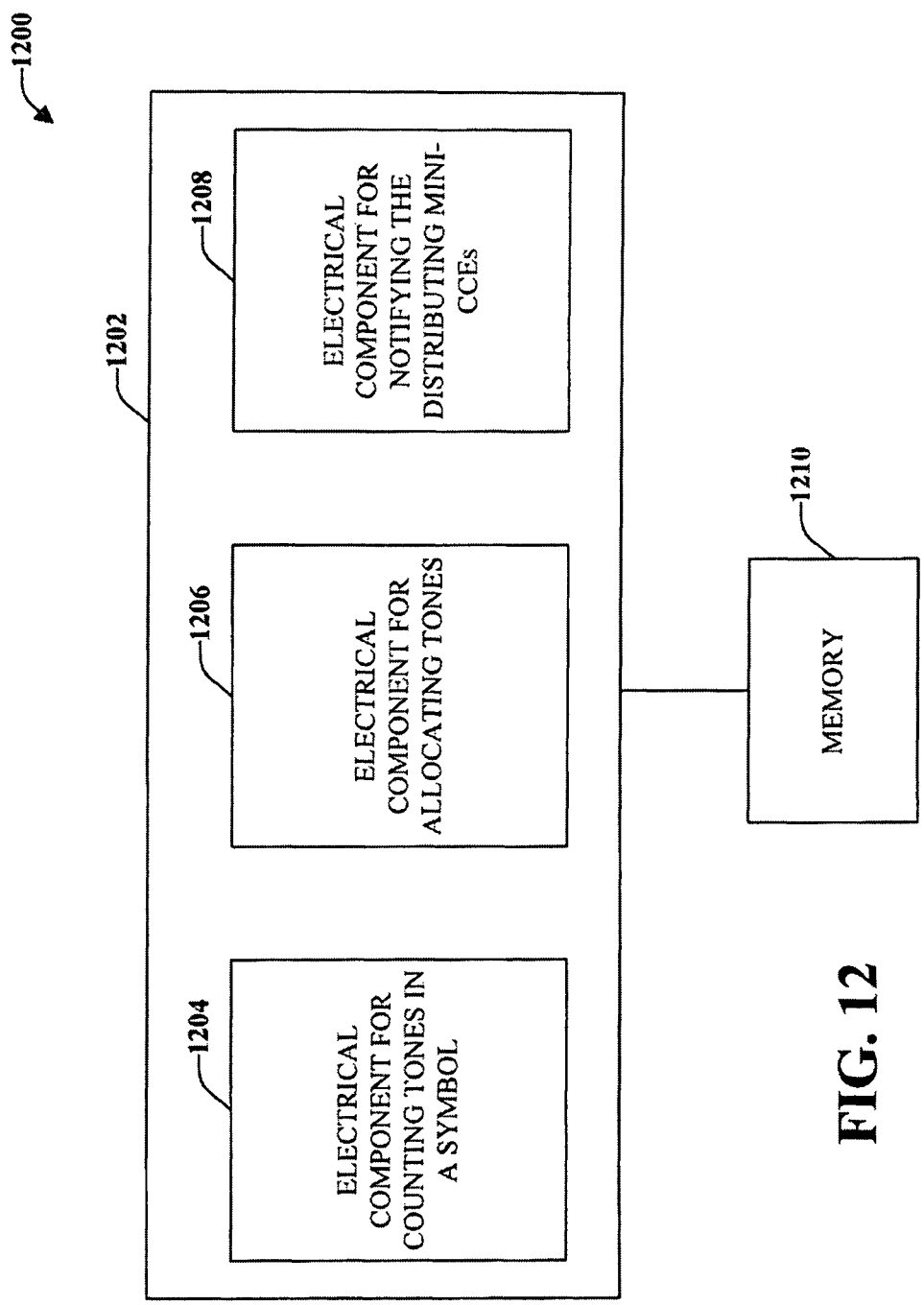
FIG. 12 illustrates an example system that enables frequency diversity when a symbol has a high initial load, according to an aspect.

FIG. 12 illustrates an example system 1200 that enables frequency diversity when a symbol has a high initial load, according to an aspect. System 1200 includes a logical grouping 1202 of electrical components that can act separately or in conjunction. Logical grouping 1202 includes an electrical component 1204 for counting Reference Signal and Physical Control Format Indicator Channel (RS+PCFICH) tones in a symbol with a high initial load. Also included in logical grouping 1202 is an electrical component 1206 for allocating Physical Downlink Control Channel (PDCCH) tones in symbols other than the symbol with the high initial load until the PDCCH tones allocated is equal to the counted RS+PCFICH tones. Further, logical grouping 1202 includes an electrical component 1208 for distributing the PDCCH mini-CCEs across all symbols. The PDCCH mini-CCEs are distributed uniformly across the symbols.

System 1200 can also include a memory 1210 that retains instructions for executing functions associated with electrical components 1204, 1206, and 1208 or other components. While shown as being external to memory 1210, it is to be understood that one or more of electrical components 1204, 1206, and 1208 can exist within memory 1210.

It is to be understood that the aspects described herein may be implemented by hardware, software, firmware or any combination thereof. When implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

For a software implementation, the techniques described herein may be implemented with modules (e.g., procedures, functions, and so on) that perform the functions described herein. The software codes may be stored in memory units and executed by processors. The memory unit may be implemented within the processor or external to the processor, in which case it can be communicatively coupled to the processor through various means as is known in the art. Further, at least one processor may include one or more modules operable to perform the functions described herein.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11

(Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform the functions described herein.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

While the foregoing disclosure discusses illustrative aspects and/or aspects, it should be noted that various changes and modifications could be made herein without departing from the scope of the described aspects and/or aspects as defined by the appended claims. Accordingly, the described aspects are intended to embrace all such alterations, modifications and variations that fall within scope of the appended claims. Furthermore, although elements of the described aspects and/or aspects may be described or claimed in the singular, the plural is contemplated unless limitation to the singular is explicitly stated. Additionally, all or a portion of any aspect and/or aspect may be utilized with all or a portion of any other aspect and/or aspect, unless stated otherwise.

To the extent that the term "includes" is used in either the detailed description or the claims, such term is intended to be inclusive in a manner similar to the term "comprising" as "comprising" is interpreted when employed as a transitional word in a claim. Furthermore, the term "or" as used in either the detailed description or the claims is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A method for enabling frequency diversity, comprising:
   defining diversity regions across a network bandwidth;
   binning available mini-control channel elements to the defined diversity regions;
   performing a bit-reverse interleave on diversity region indices;
   mapping the mini-control channel elements to the binned diversity regions, including performing a symbol dependent mapping of the mini-control channel elements to the binned diversity regions in a cyclic diagonal fashion;
   randomly permuting the mapped mini-control channel elements in each diversity region;
   applying a cell dependent cyclic shift in the frequency domain; and
   establishing a mapping between available mini-control channel elements and resource elements based on the permuting of the mapped mini-control channel elements.

2. The method of claim 1, wherein the diversity regions are defined separately for each symbol.

3. The method of claim 1, wherein mapping the mini-control channel elements to the binned locations comprises mapping Physical Hybrid-ARQ Indicator Channel (PHICH) mini-CCEs before mapping Physical Downlink Control Channel (PDCCH) mini-CCEs.

4. The method of claim 1, wherein randomly permuting control elements in each diversity region is performed in each control symbol independently.

5. The method of claim 1, wherein randomly permuting control elements in each diversity region is performed independently of whether one or more mini-CCEs are used.

6. The method of claim 1, wherein performing a bit-reverse interleave comprises iteratively adding elements in a permutation cycle structure.

7. The method of claim 1, wherein frequency diversity is enabled for PHICH resource allocation and PDCCH allocation.

8. A wireless communications apparatus, comprising:
   a memory that retains instructions related to defining diversity regions across a network bandwidth, binning available mini-control channel elements to the defined diversity regions, performing a bit-reverse interleave on diversity region indices, mapping the mini-control channel elements to the binned diversity regions, including performing a symbol dependent mapping of the mini-control channel elements to the binned diversity regions in a cyclic diagonal fashion, randomly permuting the mapped mini-control channel elements in each diversity region, applying a cell dependent cyclic shift in the frequency domain, and establishing a mapping between available mini-control channel elements and resource elements based on the permuting of the mapped mini-control channel elements; and a processor, coupled to the memory, configured to execute the instructions retained in the memory.

9. The wireless communications apparatus of claim 8, wherein the diversity regions are defined separately for each symbol.

10. The wireless communications apparatus of claim 8, wherein Physical Hybrid-ARQ Indicator Channel (PHICH) mini-CCEs are mapped before mapping Physical Downlink Control Channel (PDCCH) mini-CCEs.

11. The wireless communications apparatus of claim 8, wherein the permutation of control elements in each diversity region is performed in each control symbol independently.

12. The wireless communications apparatus of claim 8, wherein the permutation of control elements in each diversity region is performed independently of whether one or more mini-CCEs are used.

13. A wireless communications apparatus that enables frequency diversity, comprising:
    means for defining diversity regions across a network bandwidth;
    means for binning available mini-control channel elements to the defined diversity regions;
    means for performing a bit-reverse interleave on diversity region indices;
    means for mapping the mini-control channel elements to the binned diversity regions, including means for performing a symbol dependent mapping of the mini-control channel elements to the binned diversity regions in a cyclic diagonal fashion;
    means for permuting the mapped mini-control channel elements in each diversity region;
    means for applying a cell dependent cyclic shift in the frequency domain; and
    means for establishing a mapping between available mini-control channel elements and resource elements based on the permuting of the mapped, mini-control channel elements.

14. The wireless communications apparatus of claim 13, wherein the diversity regions are defined separately for each symbol.

15. The wireless communications apparatus of claim 13, wherein the means for mapping the mini-control channel elements to the binned locations maps Physical Hybrid-ARQ Indicator Channel (PHICH) mini-CCEs before mapping Physical Downlink Control Channel (PDCCH) mini-CCEs.

16. The wireless communications apparatus of claim 13, wherein the control elements in each diversity region is permuted in each control symbol independently.

17. A non-transitory machine readable medium, comprising:
    a first set of codes for causing a computer to define diversity regions across a network bandwidth, wherein the diversity regions are defined separately for each symbol;
    a second set of codes for causing the computer to bin available mini-control channel elements to the defined diversity regions;
    a third set of codes for causing the computer to perform a bit-reverse interleave on diversity region indices;
    a fourth set of codes for causing the computer to map the mini-control channel elements to the binned diversity regions, including performing a symbol dependent mapping of the mini-control channel elements to the binned diversity regions in a cyclic diagonal fashion;
    a fifth set of codes for causing the computer to permute the mapped mini-control channel elements in each diversity region;
    a sixth set of codes for causing the computer to apply a cell dependent cyclic shift in the frequency domain; and
    a seventh set of codes for causing the computer to establish a mapping between available mini-control channel elements and resource elements based on the permuting of the mapped mini-control channel elements.

18. At least one processor configured to enable frequency diversity, comprising:
    a first module for defining diversity regions across a network bandwidth;
    a second module for binning available mini-control channel elements to the defined diversity regions;
    a third module for performing a bit-reverse interleave on diversity region indices;
    a fourth module for mapping the mini-control channel elements to the binned diversity regions, including performing a symbol dependent mapping of the mini-control channel elements to the binned diversity regions in a cyclic diagonal fashion;
    a fifth module for randomly permuting the mapped mini-control channel elements in each diversity region;
    a sixth module for applying a cell dependent cyclic shift in the frequency domain; and
    a seventh module for establishing a mapping between available mini-control channel elements and resource elements based on the permuting of the mapped mini-control channel elements.

\* \* \* \* \*